(12) United States Patent
Wilson

(10) Patent No.: US 8,030,133 B2
(45) Date of Patent: Oct. 4, 2011

(54) METHOD OF FABRICATING A BONDED WAFER SUBSTRATE FOR USE IN MEMS STRUCTURES

(75) Inventor: Robin Wilson, Belfast (GB)

(73) Assignee: Icemos Technology Ltd., Belfast, Northern Ireland (GB)

(*) Notice: Subject to any disclaimer, the term of this patent is extended or adjusted under 35 U.S.C. 154(b) by 325 days.

(21) Appl. No.: 12/413,972

(22) Filed: Mar. 30, 2009

(65) Prior Publication Data

US 2010/0065946 A1    Mar. 18, 2010

Related U.S. Application Data

(60) Provisional application No. 61/040,210, filed on Mar. 28, 2008.

(51) Int. Cl.
H01L 21/00 (2006.01)
H01L 29/06 (2006.01)

(52) U.S. Cl. ........ 438/107; 438/456; 438/459; 257/618; 257/E21.211

(58) Field of Classification Search .................. None
See application file for complete search history.

(56) References Cited

U.S. PATENT DOCUMENTS

| | | |
|---|---|---|
| 4,158,206 A | 6/1979 | Neilson |
| 4,211,582 A | 7/1980 | Horng et al. |
| 4,238,278 A | 12/1980 | Antipov |
| 4,491,486 A | 1/1985 | Iwai |
| 4,771,016 A | 9/1988 | Bajor et al. |
| 4,866,004 A | 9/1989 | Fukushima |
| 4,895,810 A | 1/1990 | Meyer et al. |
| 4,994,406 A | 2/1991 | Vasquez et al. |
| 5,019,522 A | 5/1991 | Meyer et al. |
| 5,045,903 A | 9/1991 | Meyer et al. |
| 5,216,275 A | 6/1993 | Chen |
| 5,266,135 A | 11/1993 | Short et al. |
| 5,334,273 A | 8/1994 | Short et al. |
| 5,362,667 A | 11/1994 | Linn et al. |
| 5,366,914 A | 11/1994 | Takahashi et al. |
| 5,387,555 A | 2/1995 | Linn et al. |
| 5,395,790 A | 3/1995 | Lur |
| 5,432,113 A | 7/1995 | Tani |
| 5,435,888 A | 7/1995 | Kalnitsky et al. |
| 5,472,888 A | 12/1995 | Kinzer |
| 5,506,421 A | 4/1996 | Palmour |
| 5,517,047 A | 5/1996 | Linn et al. |
| 5,598,018 A | 1/1997 | Lidow et al. |
| 5,726,469 A | 3/1998 | Chen |

(Continued)

FOREIGN PATENT DOCUMENTS

WO    2005001941 A3    1/2005

(Continued)

*Primary Examiner* — Alonzo Chambliss
(74) *Attorney, Agent, or Firm* — Panitch Schwarze Belisario & Nadel LLP

(57) ABSTRACT

A method of manufacturing a semiconductor device includes providing first and second semiconductor substrates, each having first and second main surfaces opposite to one another. A roughened surface is formed on at least one of the first main surface of the first semiconductor substrate and the second main surface of the second semiconductor substrate. A dielectric layer is formed on the first main surface of the semiconductor substrate and the second semiconductor substrate is disposed on the dielectric layer opposite to the first semiconductor substrate. The second main surface of the second semiconductor substrate contacts the dielectric layer.

10 Claims, 17 Drawing Sheets

U.S. PATENT DOCUMENTS

| | | | |
|---|---|---|---|
| 5,728,624 A | 3/1998 | Linn et al. |
| 5,742,087 A | 4/1998 | Lidow et al. |
| 5,744,852 A | 4/1998 | Linn et al. |
| 5,744,994 A | 4/1998 | Williams |
| 5,786,619 A | 7/1998 | Kinzer |
| 5,849,627 A | 12/1998 | Linn et al. |
| 5,902,127 A | 5/1999 | Park |
| 5,926,713 A | 7/1999 | Hause et al. |
| 5,929,690 A | 7/1999 | Williams |
| 5,939,754 A | 8/1999 | Hoshi |
| 5,994,751 A | 11/1999 | Oppermann |
| 6,008,106 A | 12/1999 | Tu et al. |
| 6,081,009 A | 6/2000 | Neilson |
| 6,174,773 B1 | 1/2001 | Fujishima |
| 6,175,141 B1 | 1/2001 | Hofbauer et al. |
| 6,184,555 B1 | 2/2001 | Tihanyi et al. |
| 6,190,970 B1 | 2/2001 | Liao et al. |
| 6,198,127 B1 | 3/2001 | Kocon |
| 6,214,698 B1 | 4/2001 | Liaw et al. |
| 6,222,229 B1 | 4/2001 | Hebert et al. |
| 6,239,463 B1 | 5/2001 | Williams et al. |
| 6,265,281 B1 | 7/2001 | Reinberg |
| 6,291,856 B1 | 9/2001 | Miyasaka et al. |
| 6,300,171 B1 | 10/2001 | Frisina |
| 6,307,246 B1 | 10/2001 | Nitta et al. |
| 6,310,365 B1 | 10/2001 | Chen |
| 6,359,309 B1 | 3/2002 | Liao et al. |
| 6,362,505 B1 | 3/2002 | Tihanyi |
| 6,391,723 B1 | 5/2002 | Frisina |
| 6,410,958 B1 | 6/2002 | Usui et al. |
| 6,426,991 B1 | 7/2002 | Mattson et al. |
| 6,452,230 B1 | 9/2002 | Boden, Jr. |
| 6,459,124 B1 | 10/2002 | Zhang et al. |
| 6,465,325 B2 | 10/2002 | Ridley et al. |
| 6,495,421 B2 | 12/2002 | Luo |
| 6,501,130 B2 | 12/2002 | Disney |
| 6,501,146 B1 | 12/2002 | Harada |
| 6,504,230 B2 | 1/2003 | Deboy et al. |
| 6,509,220 B2 | 1/2003 | Disney |
| 6,512,267 B2 | 1/2003 | Kinzer et al. |
| 6,534,367 B2 | 3/2003 | Peake et al. |
| 6,566,201 B1 | 5/2003 | Blanchard |
| 6,613,644 B2 | 9/2003 | Lachner |
| 6,624,494 B2 | 9/2003 | Blanchard et al. |
| 6,635,906 B1 | 10/2003 | Chen |
| 6,686,244 B2 | 2/2004 | Blanchard |
| 6,710,400 B2 | 3/2004 | Blanchard |
| 6,710,403 B2 | 3/2004 | Sapp |
| 6,710,418 B1 | 3/2004 | Sapp |
| 6,713,813 B2 | 3/2004 | Marchant |
| 6,762,473 B1 | 7/2004 | Goushcha et al. |
| 6,787,872 B2 | 9/2004 | Kinzer et al. |
| 6,797,589 B2 | 9/2004 | Adams et al. |
| 6,936,867 B2 | 8/2005 | Chen |
| 6,936,907 B2 | 8/2005 | Chen |
| 6,998,681 B2 | 2/2006 | Chen |
| 7,015,104 B1 | 3/2006 | Blanchard |
| 7,023,069 B2 | 4/2006 | Blanchard |
| 7,041,560 B2 | 5/2006 | Hshieh |
| 7,052,982 B2 | 5/2006 | Hshieh et al. |
| 7,109,110 B2 | 9/2006 | Hshieh |
| 7,242,069 B2 | 7/2007 | Bui et al. |
| 7,446,018 B2 | 11/2008 | Brogan et al. |
| 7,579,667 B2 | 8/2009 | Brogan et al. |
| 2002/0070418 A1 | 6/2002 | Kinzer et al. |
| 2005/0090107 A1* | 4/2005 | Draney et al. ............... 438/690 |
| 2005/0176192 A1 | 8/2005 | Hshieh |
| 2007/0063217 A1* | 3/2007 | Brogan et al. ............... 257/133 |

FOREIGN PATENT DOCUMENTS

WO 2005031880 A1 4/2005

* cited by examiner

US 8,030,133 B2

METHOD OF FABRICATING A BONDED WAFER SUBSTRATE FOR USE IN MEMS STRUCTURES

CROSS REFERENCE TO RELATED APPLICATIONS

This application claim the benefit of U.S. Provisional Patent Application No. 61/040,210, filed Mar. 28, 2008, entitled "Bonded Wafer Substrate for Use in MEMS Structures," the entire contents of which are incorporated by reference herein.

BACKGROUND OF THE INVENTION

An embodiment of the present invention relates generally to a method of manufacturing a semiconductor device, and more particularly, to a method of manufacturing a silicon-on-insulator (SOI) wafer for use in microelectromechanical systems (MEMS).

Semiconductor wafer fabrication generally refers to the process of making integrated circuits on silicon wafers. A typical semiconductor wafer is generally circular in plan view and has a diameter on the order of 25-300 millimeters (mm). Individual electronic circuits or devices are formed across at least one surface of the wafer and then the wafer is typically cut (sawed or diced) into a plurality of individual "dies" for packaging into individual integrated circuits (ICs).

SOI semiconductors, dielectric isolation (DI) semiconductors, and bonded wafer semiconductor devices are generally known in the art. For example, basic known processes to bond semiconductor wafers include forming a layer of silicon dioxide (which may be a buried oxide layer) on one silicon wafer, sometimes referred to as the "handle wafer," placing a second silicon wafer (device layer) on the silicon dioxide, and annealing (i.e., generally heating to and holding at a suitable temperature and then cooling at a suitable rate) the stacked wafers to form a bonded wafer semiconductor device having a buried oxide layer. Other methods of forming SOI semiconductor wafers are also known.

The development of MEMS technology has provided the ability to combine microelectronic circuits and mechanical parts, such as cantilevers, membranes, holes, and the like, onto a single chip. MEMS chips may be developed to provide, for example, inertia sensors (e.g., for use in an accelerometer), radio frequency (RF) switches, and pressure sensors, and may also be used in optics applications, such as for digital light processing (DLP) televisions.

The MEMS chips are often manufactured using SOI wafers, wherein at least a portion of the buried oxide layer is etched out as a sacrificial layer. In the example of an inertia sensor, a proof mass is formed in the device layer and is suspended from the device layer by one or more membranes. Following the removal of the buried oxide layer, the proof mass is free to move in the resulting cavity.

Unfortunately, difficulties may arise to the extent that the proof mass or the membranes may contact the top surface of the handle wafer. Typically, the bottom surface of the device layer and the top layer of the handle wafer are highly polished. As a result, the two surfaces are prone to sticking to one another by way of the electrostatic or van der Waals forces. This phenomenon is known as "stiction."

It is desirable to manufacture a SOI wafer, and more specifically a MEMS device, such that the SOI substrate stiction may be eliminated or greatly reduced between the handle wafer and device layer surfaces.

BRIEF SUMMARY OF THE INVENTION

Briefly stated, various embodiments of the present invention comprise a method of manufacturing a semiconductor device. The method includes providing a first semiconductor substrate having first and second main surfaces opposite to each other and providing a second semiconductor substrate having first and second main surfaces opposite to each other. A roughened surface is formed on at least one of the first main surface of the first semiconductor substrate and the second main surface of the second semiconductor substrate. A dielectric layer is formed on the first main surface of the semiconductor substrate and the second semiconductor substrate is disposed on the dielectric layer opposite to the first semiconductor substrate. The second main surface of the second semiconductor substrate contacts the dielectric layer.

Other preferred embodiments of the present invention comprise a method of manufacturing a semiconductor device. The method includes providing a first semiconductor substrate having first and second main surfaces opposite to each other. A second semiconductor substrate is provided having first and second main surfaces opposite to each other. A cavity is formed from the second main surface of the second semiconductor substrate. A dielectric layer is formed on the first main surface of the semiconductor substrate. The second semiconductor substrate is disposed on the dielectric layer opposite to the first semiconductor substrate. The second main surface of the second semiconductor substrate contacts the dielectric layer. A bottom surface of the cavity is roughened.

Various other embodiments of the present invention comprise a SOI wafer including a semiconductor substrate having first and second main surfaces opposite to each other, a dielectric layer disposed on at least a portion of the first main surface of the semiconductor substrate, and a device layer having first and second main surfaces. The second main surface of the device layer is disposed on a surface of the dielectric layer opposite to the semiconductor substrate. At least one of the first main surface of the semiconductor substrate and the second main surface of the device layer has a roughened surface.

BRIEF DESCRIPTION OF THE DRAWINGS

The foregoing summary, as well as the following detailed description of preferred embodiments of the invention, will be better understood when read in conjunction with the appended drawings. For the purpose of illustration, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1A:
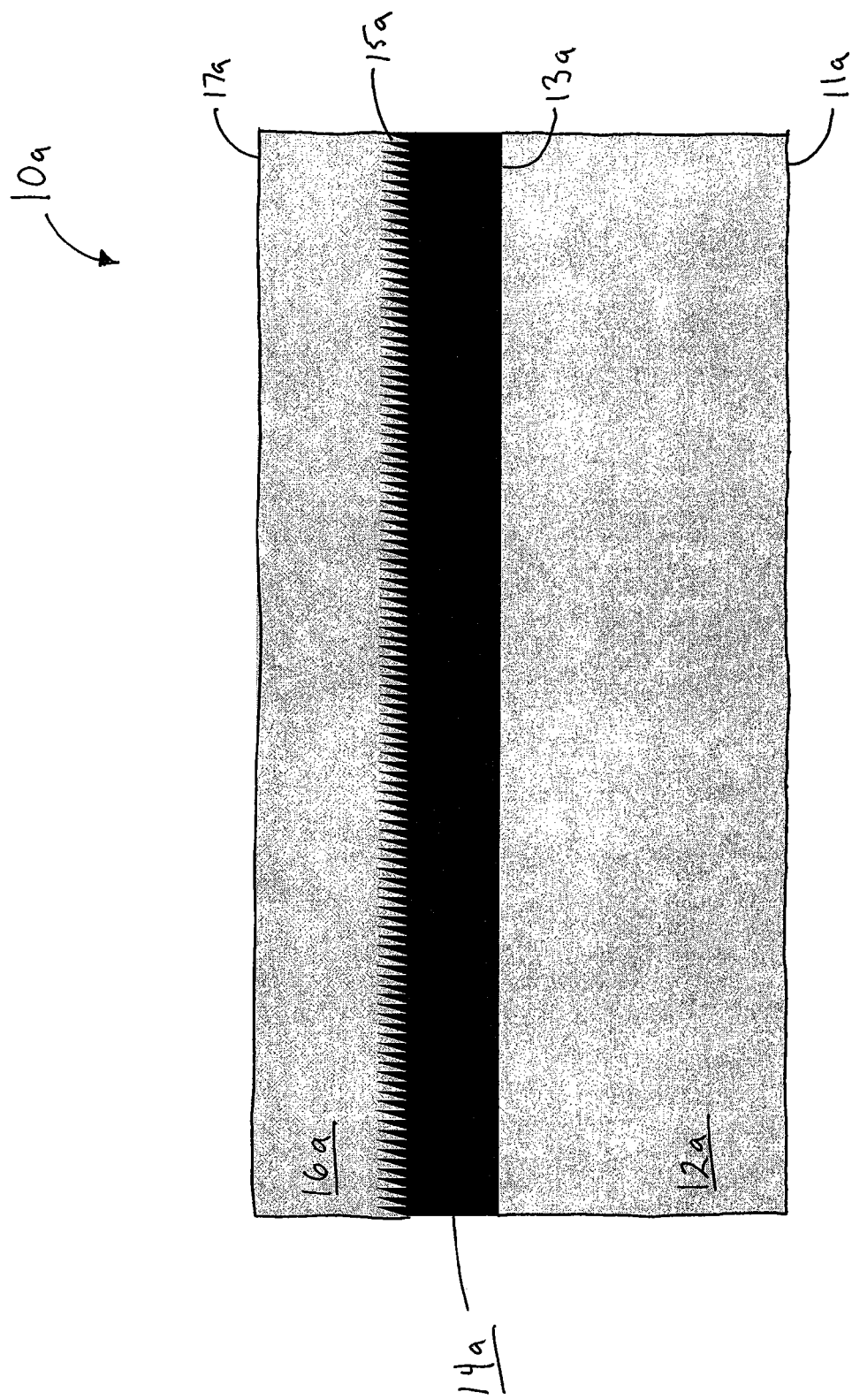
FIG. 1A is an enlarged partial cross-sectional elevational view of a SOI wafer wherein the device layer includes a roughened surface in accordance with a preferred embodiment of the present invention.

Certain terminology is used in the following description for convenience only and is not limiting. The words "right", "left", "lower", and "upper" designate directions in the drawings to which reference is made. The words "inwardly" and "outwardly" refer to directions toward and away from, respectively, the geometric center of the device and designated parts thereof. The terminology includes the above-listed words, derivatives thereof, and words of similar import.

Additionally, the words "a" and "an", as used in the claims and in the corresponding portions of the specification, mean "at least one."

As used herein, reference to conductivity will be limited to the embodiment described. However, those skilled in the art know that p-type conductivity can be switched with n-type conductivity and the device would still be functionally correct (i.e., a first or a second conductivity type). Therefore, where used herein, reference to n or p can also mean either n or p or p and n can be substituted therefor.

Furthermore, $n^+$ and $p^+$ refer to heavily doped n and p regions, respectively; $n^{++}$ and $p^{++}$ refer to very heavily doped n and p regions, respectively; $n^-$ and $p^-$ refer to lightly doped n and p regions, respectively; and $n^{--}$ and $p^{--}$ refer to very lightly doped n and p regions, respectively. However, such relative doping terms should not be construed as limiting.

Referring to the drawings in detail, wherein like reference numerals indicate like elements throughout, there is shown in FIG. 1A a partial cross-sectional elevational view of a wafer 10a manufactured in accordance with various preferred embodiments of the present invention. A handle wafer 12a includes a bottom surface 11a and a top surface 13a. A dielectric layer 14a is disposed on the top surface 13a of the handle wafer 12a. A device layer 16a is disposed on the dielectric layer 14a opposite the handle wafer 12a. The device layer 16a also includes a top surface 17a and a bottom surface 15a. The bottom surface 15a of the device layer 16a is roughened, rather than polished, which reduces the probability of stiction with the handle wafer 12a once the dielectric layer 14a is removed.

Figure 1B:
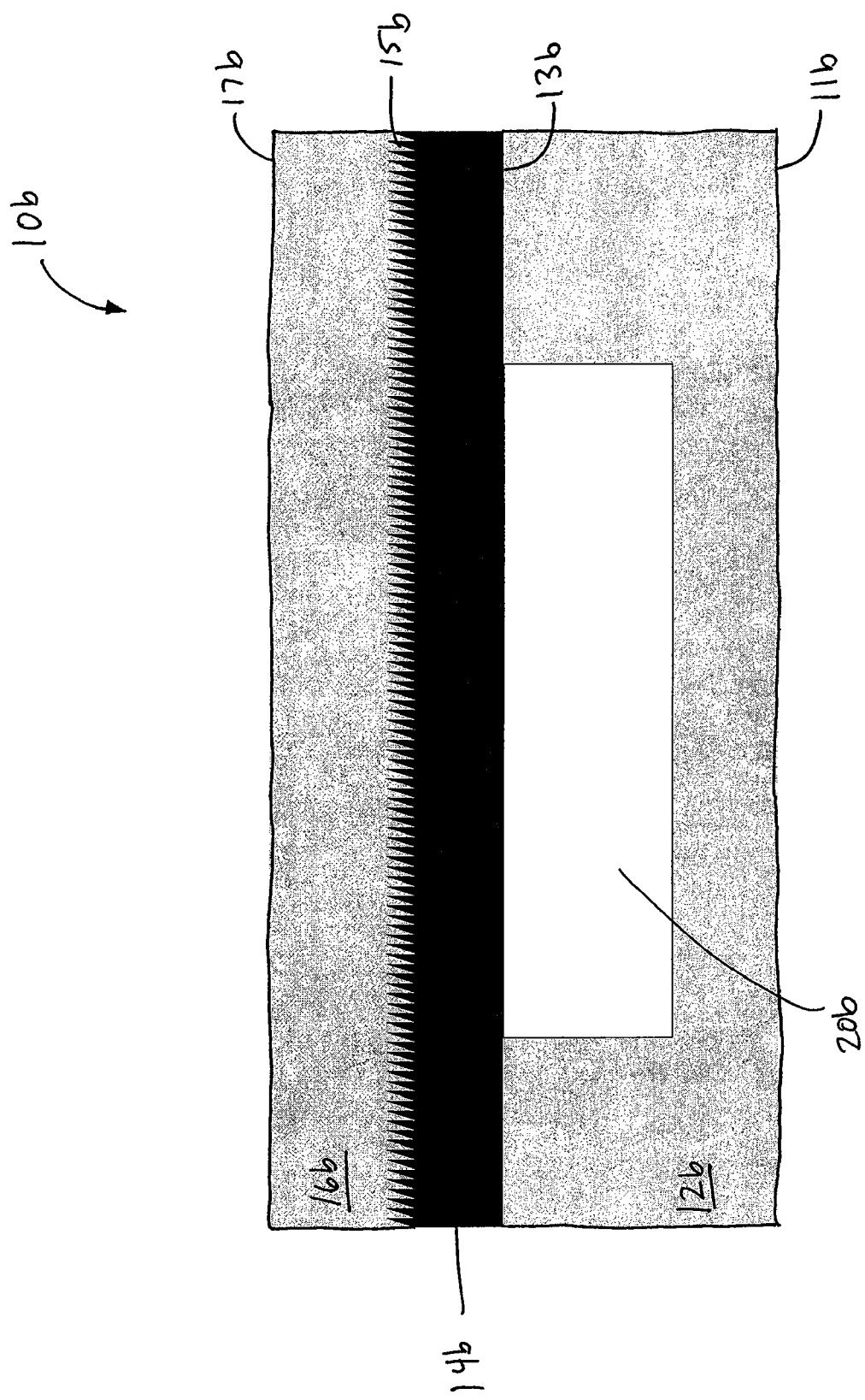
FIG. 1B is an enlarged partial cross-sectional elevational view of a SOI cavity wafer wherein the device layer includes a roughened surface in accordance with a preferred embodiment of the present invention.

FIG. 1B shows a cavity SOI wafer 10b. A cavity 20b is formed in the handle wafer 12b from the top surface 13b extending toward the bottom surface 11b. The dielectric material 14b does not fill the cavity 20b, but rather caps the cavity 20b. As before, a bottom surface 15b of the device layer 16b is roughened, unlike the smoother top surface 17b.

Figure 1C:
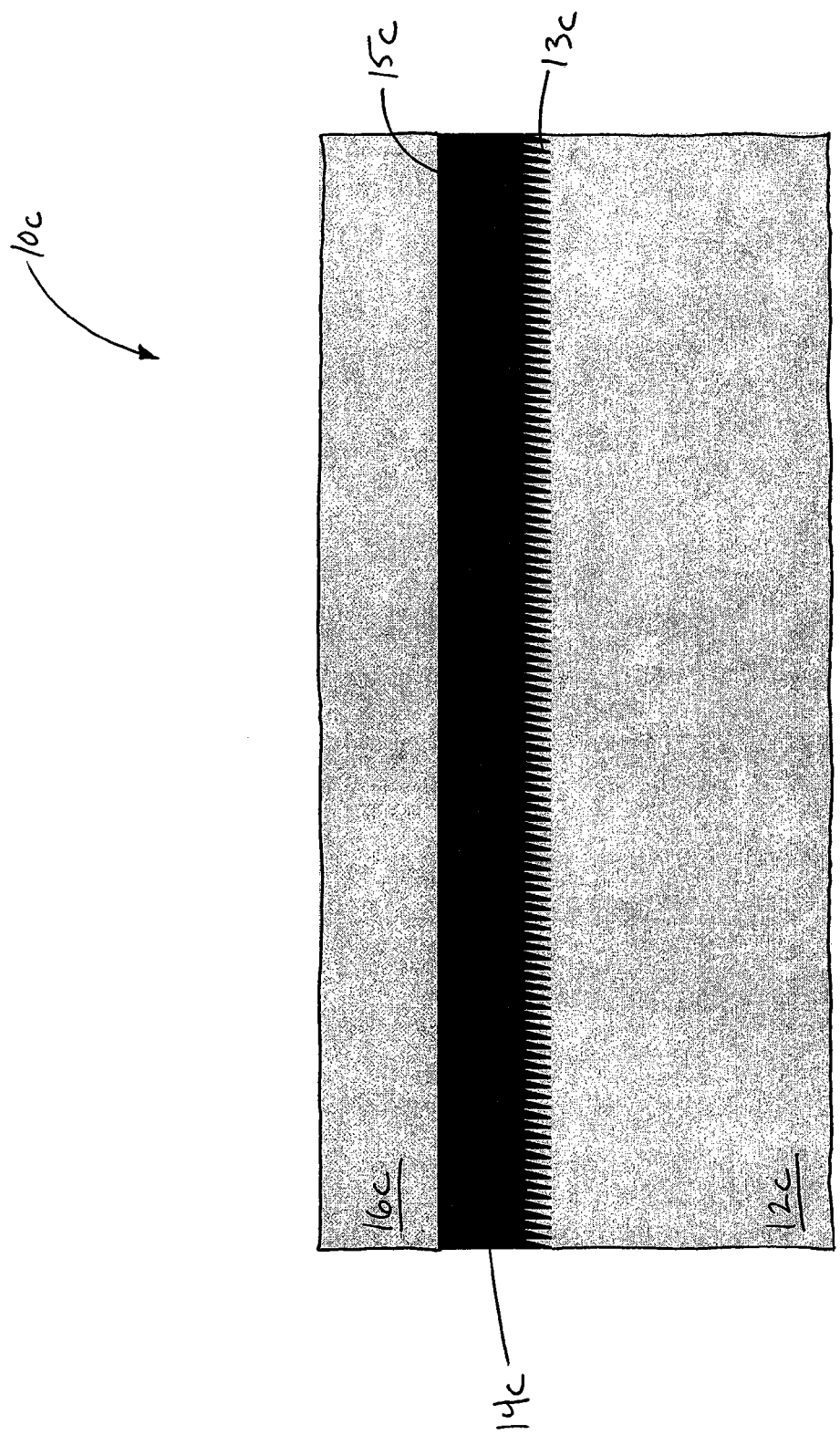
FIG. 1C is an enlarged partial cross-sectional elevational view of a SOI wafer wherein the handle wafer includes a roughened surface in accordance with a preferred embodiment of the present invention.
Figure 1D:
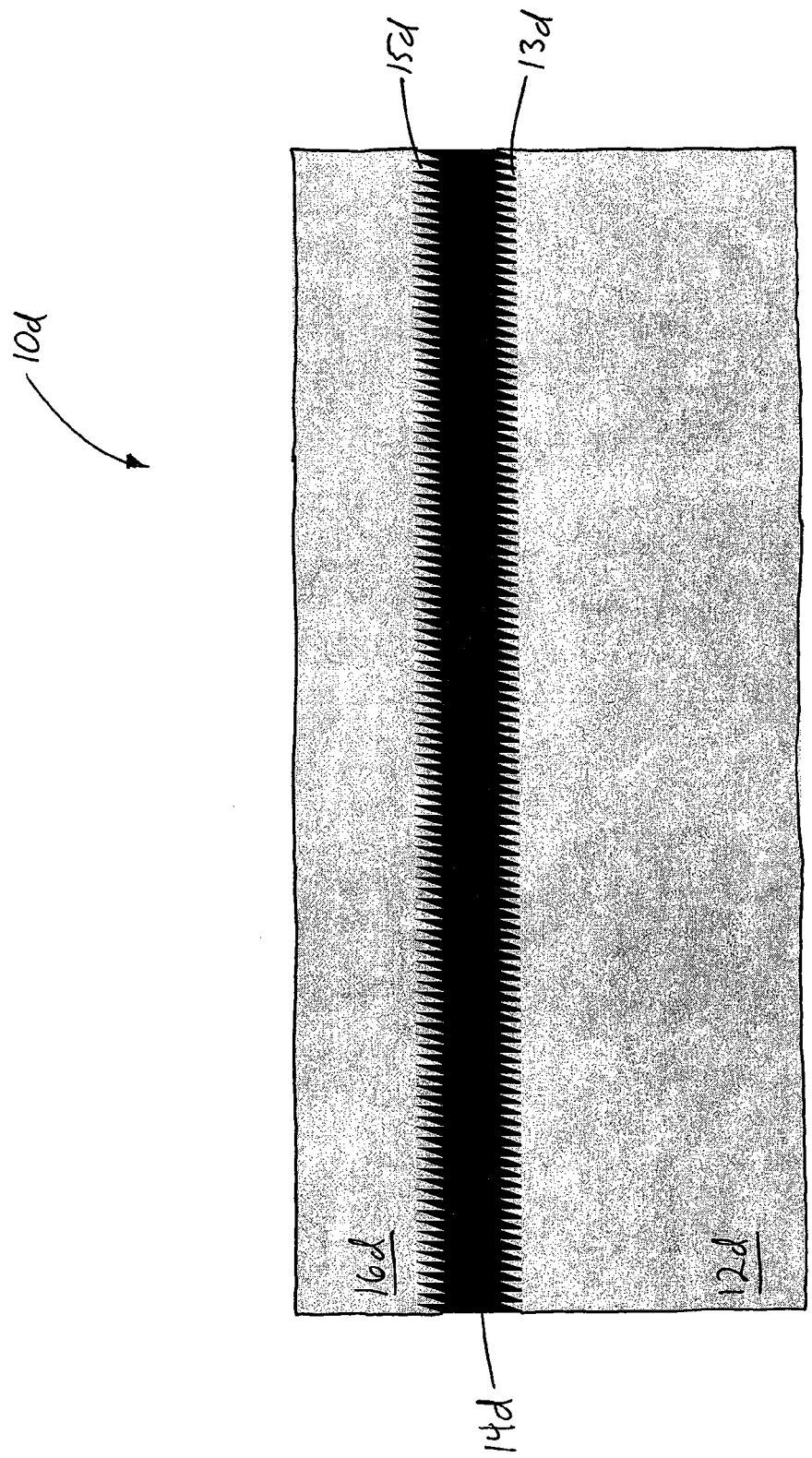
FIG. 1D is an enlarged partial cross-sectional elevational view of a SOI wafer wherein both the device layer and the handle wafer include roughened surfaces in accordance with a preferred embodiment of the present invention.

FIG. 1C shows a SOI wafer 10c wherein the device layer 16c includes a smooth bottom surface 15c. However, the top surface 13c of the handle wafer 12c, on which the dielectric layer 14c is disposed, is roughened. In FIG. 1D, both the top surface 13d of the handle wafer 12d and the bottom surface 15d of the device layer 16d are roughened and in contact with the dielectric layer 14d. In all embodiments, at least one of the top surface 13 of the handle wafer 12 and the bottom surface 15 of the device layer 16 is roughened to reduce stiction.

Figure 2A:
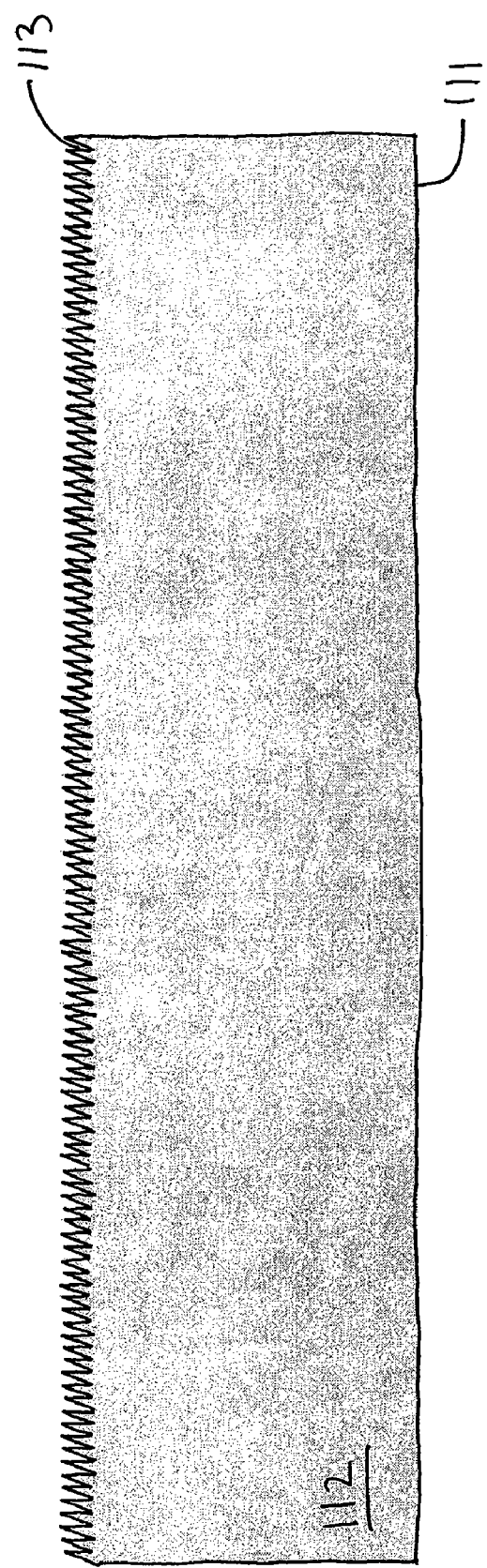
FIG. 2A is an enlarged partial cross-sectional elevational view of a handle wafer following a roughening of the top surface.

FIGS. 2A-2D illustrate a method of manufacturing a SOI wafer 110 in accordance with one preferred embodiment of the present invention. In FIG. 2A, a handle wafer 112 having opposing bottom and top surfaces 111, 113 is provided. Preferably, the handle wafer 112 is formed of silicon (Si). But, the handle wafer 112 may be formed of other materials such as gallium arsenide (GaAs), germanium (Ge), or the like. Initially, both the bottom surface 111 and the top surface 113 may be relatively smooth. In the presently described embodiment, the top surface 113 is roughened according to one or more of various techniques known in the art. For example, one may roughen the top surface 113 of the handle wafer 112 by low roughness average (Ra) grinding and/or polishing. Alternatively, one may employ deep reactive ion etching (DRIE) to roughen the surface 113. DRIE utilizes an ionized gas, or plasma, to remove material from the handle wafer 112, such as, for example, sulfur hexafluoride ($SF_6$). An isotropic wet chemical etch is also available for surface roughening. Wet etching includes the application of a liquid etchant to the surface 113 of the handle wafer 112, such as, for example, a hydrofluoric (HF) acid.

Figure 2B:
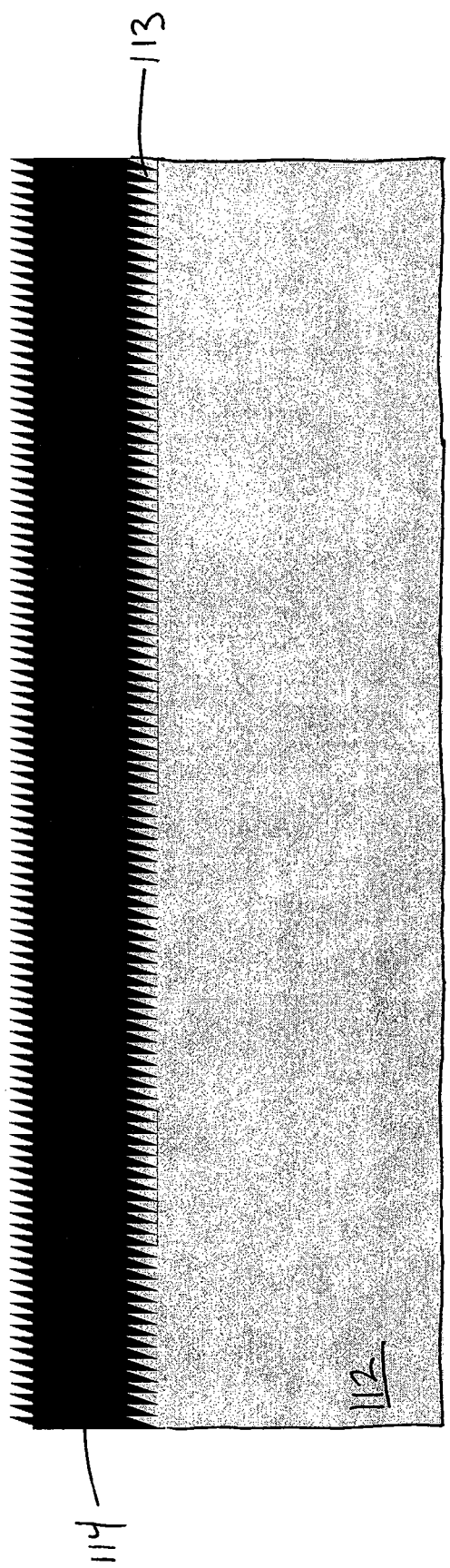
FIG. 2B is an enlarged partial cross-sectional elevational view of the handle wafer of FIG. 2A following deposition of a dielectric layer.

In FIG. 2B, a dielectric or buried oxide layer 114 is formed on the rough top surface 113 of the handle wafer 112. The dielectric layer 114 may be applied using one of thermal growth, low pressure (LP) chemical vapor deposition (CVD), plasma enhanced chemical vapor deposition (PECVD), atmospheric pressure chemical vapor deposition (APCVD), and deposition. The dielectric layer 114 is preferably formed of an oxide. Alternatively, the dielectric layer 114 may be a nitride, silicon-oxynitride, or other known dielectrics. The dielectric layer 114 on the handle wafer 112 may be formed by any known technique. The dielectric layer 114 may also be made from multiple layers of the same or different materials.

Figure 2C:
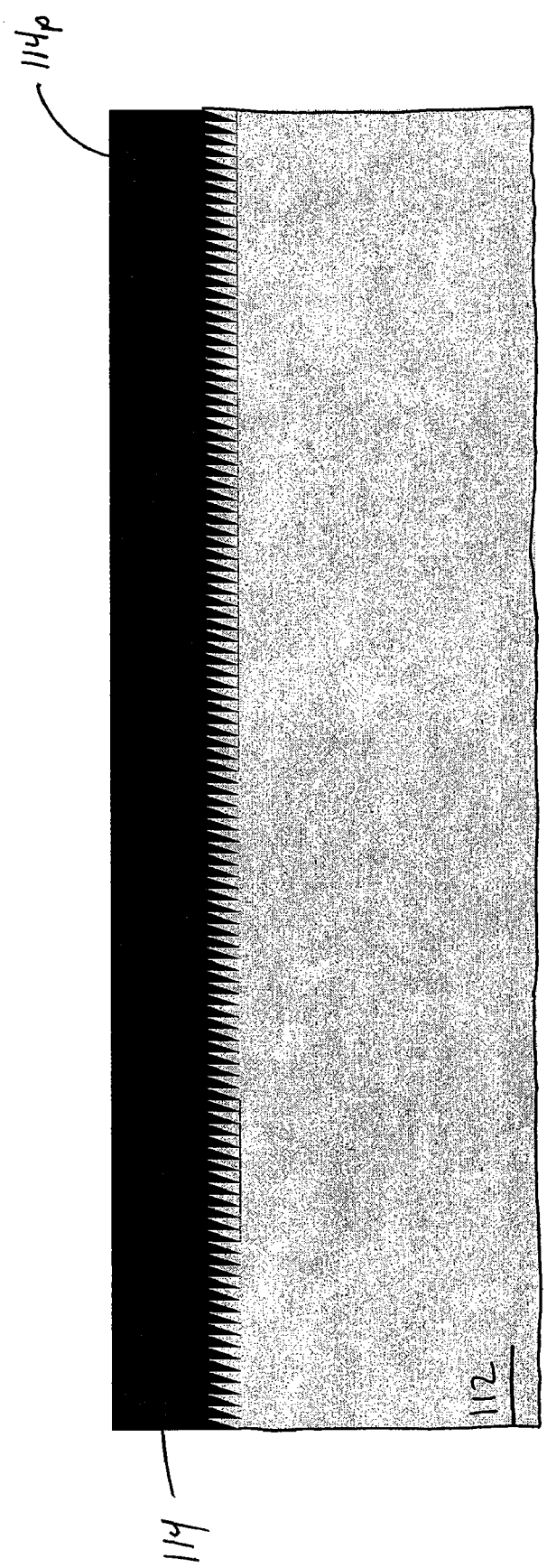
FIG. 2C is an enlarged partial cross-sectional elevational view of the handle wafer of FIG. 2B following polishing of the top surface of the dielectric layer.

Referring to FIG. 2C, preferably, a top surface 114p of the dielectric layer 114 may be ground and/or polished sufficiently to leave a polished, flat, clean surface, which is ideally defect free. For example, a chemical-mechanical polishing (CMP) process may be used to planarize the top surface 114p of the dielectric layer 114. CMP employs a polishing pad in conjunction with an applied corrosive chemical slurry. CMP is generally a finer process than grinding, though the top surface 114p of the dielectric layer 114 may first be ground, if necessary, using processes described above to achieve a desired thickness of the dielectric layer 114.

Figure 2D:
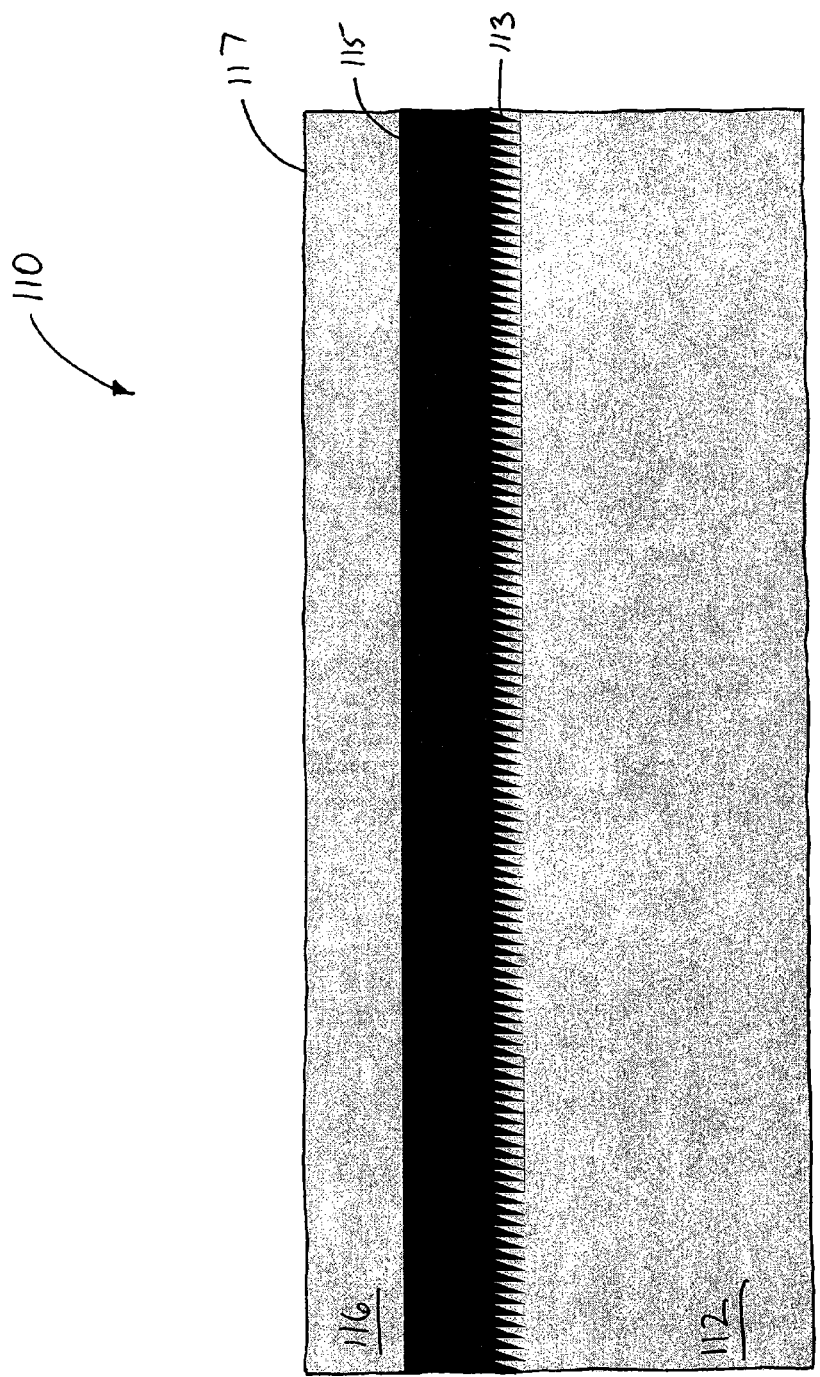
FIG. 2D is an enlarged partial cross-sectional elevational view of the handle wafer of FIG. 2C following application of a device layer.

Referring to FIG. 2D, a device layer 116 having bottom and top surfaces 115, 117 can be formed by bonding or otherwise forming a semiconductor layer on the dielectric layer 114. Preferably, the device layer 116 is silicon. But, the device layer 116 may be formed of other materials such as gallium arsenide, germanium, or the like. For example, the device layer 116 is typically a doped p-type or n-type silicon layer.

When the device layer 116 is formed on the dielectric layer 114 opposite the handle wafer 112, the stacked wafers 112, 116 are annealed (i.e., generally heated to and held at a suitable temperature and then cooled at a suitable rate) to form the bonded-wafer semiconductor device 110. The annealing/bonding process may include heating the stacked wafers 112, 116 in an annealing furnace for a number of minutes or hours. For example, the stacked wafers 112, 116 may be placed in an annealing furnace at 800-1200° C. for few a minutes to several hours to cause the materials to sufficiently bond. The annealing process may be performed in an inert ambient atmosphere, e.g., nitrogen gas, or in an oxidizing ambient atmosphere, e.g., pure oxygen, oxygen/nitrogen mixture, steam or the like. During a "wet" anneal, i.e., when steam is the ambient, the steam is generated using a mixture of oxygen and hydrogen typically above 800° C. Other known methods of bonding wafers 112, 116 to form SOI devices 110 include using a liquid oxidant or multiple layers of oxides and/or nitrides between the wafers prior to annealing.

Following the bonding of the wafers 112, 116, the top surface 117 of the device layer 116 is ground and polished, according to techniques described above, to the required thickness. The SOI device 110 is thus ready for subsequent processing, such as formation of proof masses, removal of a portion of the dielectric layer 114, or the like.

It is apparent to one skilled in the art that various embodiments are not limited to the method described above. For example, the top surface 113 of the handle wafer 112 may be polished while the bottom surface 115 of the device layer 116 may be roughened using one or more of the roughening techniques described above. Such a process would result in a SOI wafer 110 similar to the device shown in FIG. 1A. Additional steps may also be performed, such as formation of a cavity in the handle wafer 112, as shown in FIG. 1B. Alternatively, both the top surface 113 of the handle wafer 112 and the bottom surface 115 of the device layer 116 may be roughened using one or more of the techniques described above. Such a process would result in a SOI wafer 110 similar to the device shown in FIG. 1D.

Figure 3A:
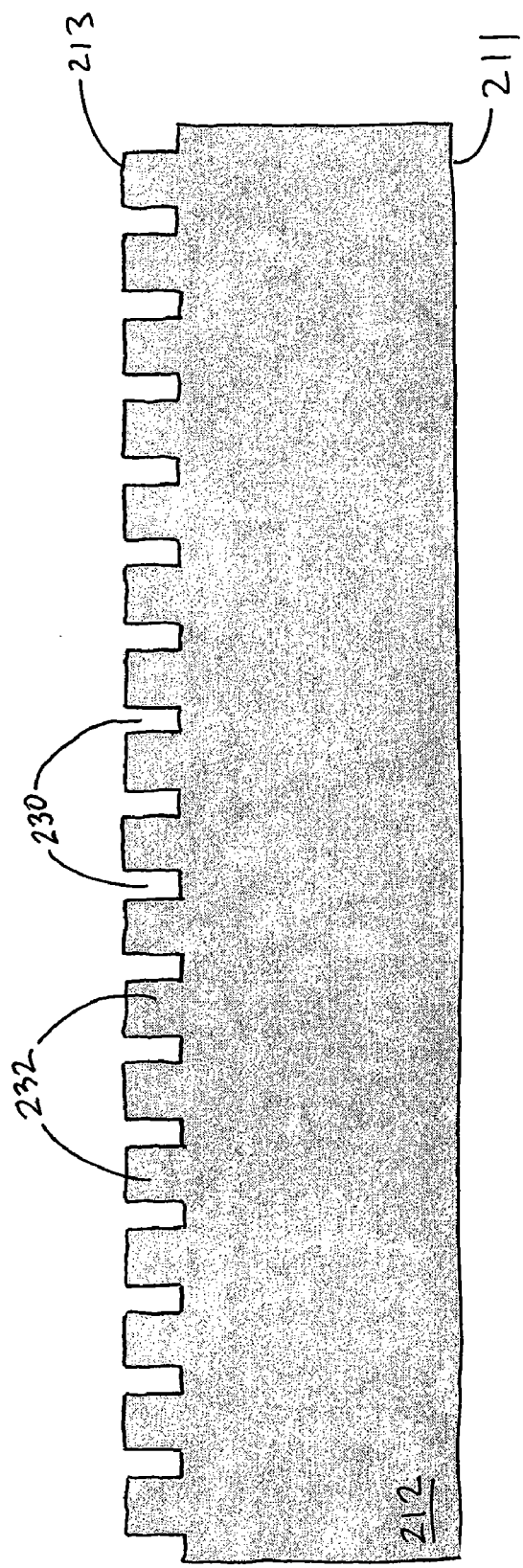
FIG. 3A is an enlarged partial cross-sectional elevational view of a handle wafer following patterning and etching of the top surface.
Figure 3B:
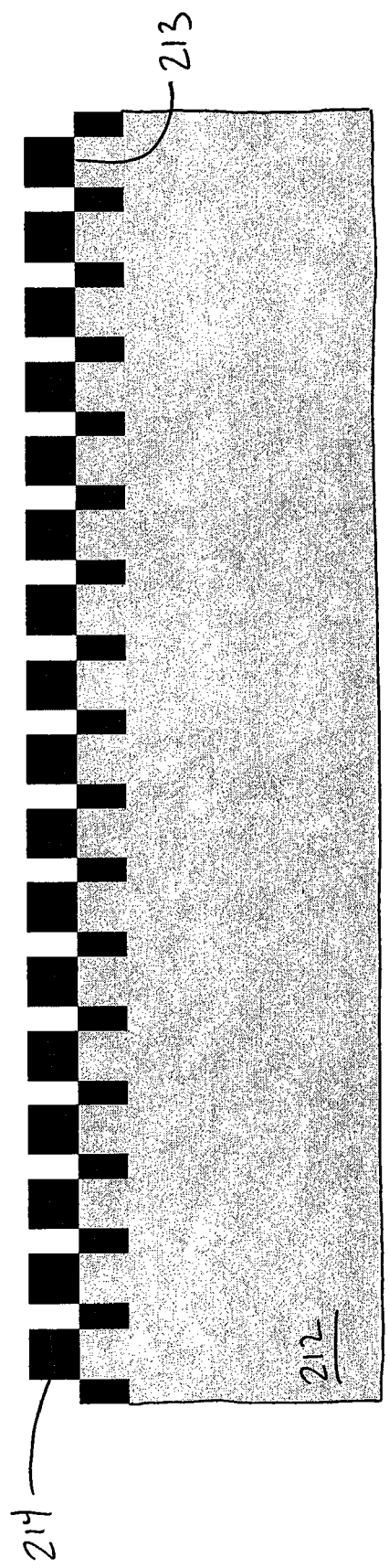
FIG. 3B is an enlarged partial cross-sectional elevational view of the handle wafer of FIG. 3A following deposition of a dielectric layer.
Figure 3C:
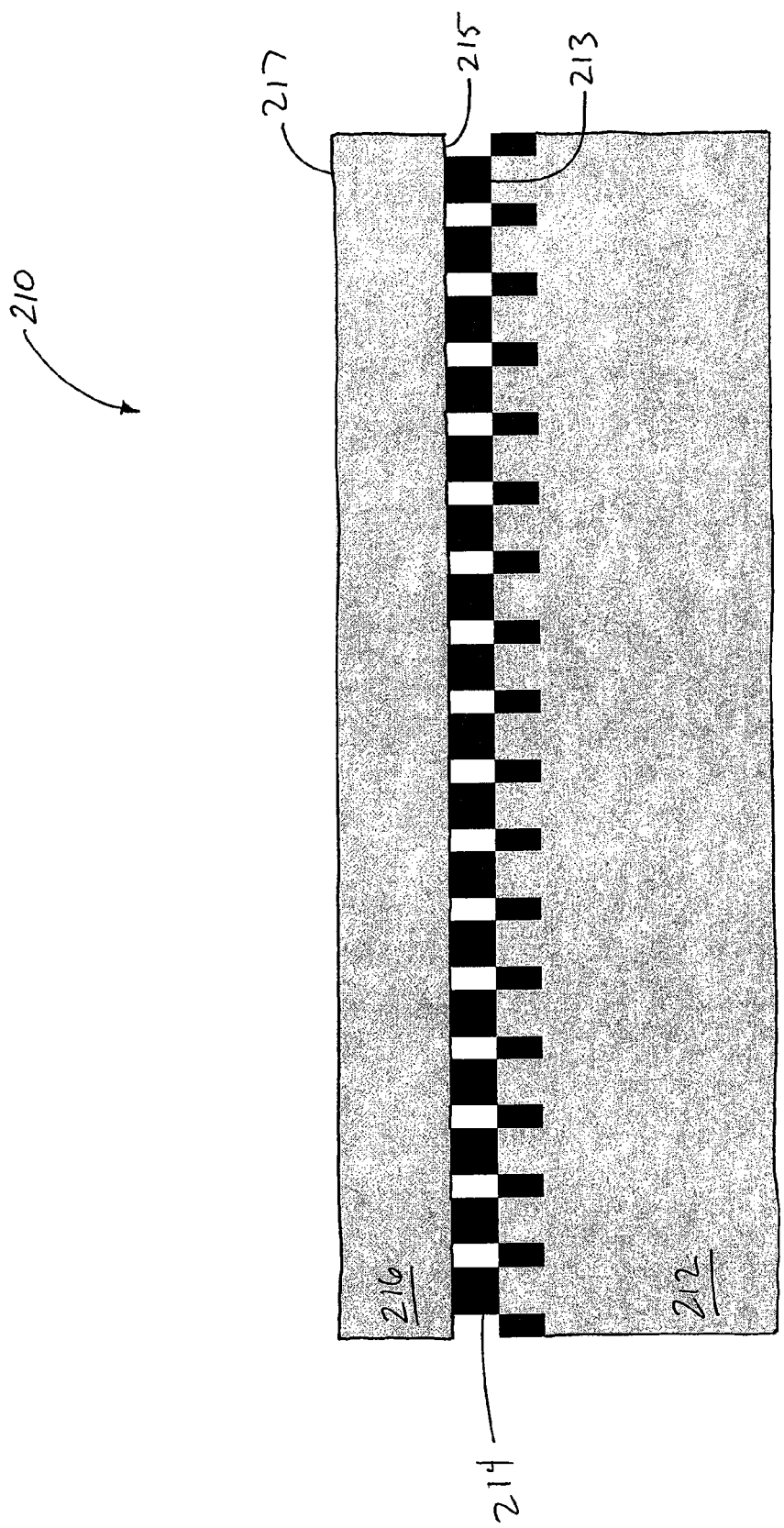
FIG. 3C is an enlarged partial cross-sectional elevational view of the handle wafer of FIG. 3B following patterning and etching of the top surface.

FIGS. 3A-3C illustrate another method of manufacturing a SOI wafer 210 in accordance with further embodiments of the present invention. In FIG. 3A, a handle wafer 212 having opposing bottom and top surfaces 111, 113 is provided. As before, the handle wafer 212 is preferably formed of silicon, but may be formed of other materials such as gallium arsenide, germanium, or the like. Initially, both the bottom surface 211 and the top surface 213 may be relatively smooth. The top surface 213 is then masked with a photoresist patterning layer (not shown) and etched to form a pattern of trenches 230 and mesas 232, preferably having a very fine pitch, to roughen the top surface 213. The pattern is not limited to the design shown in FIG. 3A but includes any pattern wherein the surface 213 of the handle wafer 212 is sufficiently varied to reduce stiction with the device layer 216 (FIG. 3C). The trenches 230 may be formed utilizing techniques known in the art such as plasma etching, RIE, sputter etching, vapor phase etching, chemical etching, DRIE, or the like.

In FIG. 3B, a dielectric or buried oxide layer 214 is formed on the trenched top surface 213 of the handle wafer 212. As described above, the buried oxide layer 214 may be applied using one of thermal growth, LPCVD, PECVD, APCVD, and deposition. The buried oxide layer 214 is again preferably formed of an oxide but may be a nitride, silicon-oxynitride, or other known dielectrics.

Referring to FIG. 3C, a device layer 216 having bottom and top surfaces 215, 217 can be formed by bonding or otherwise forming a semiconductor layer on the buried oxide layer 214. As before, the device layer 216 is preferably silicon, but may be formed of other materials such as gallium arsenide, germanium, or the like. For example, the device layer 216 is typically a doped p-type or n-type silicon layer. When the device layer 216 is placed on the dielectric layer 214 opposite the handle wafer 212, the stacked wafers 212, 216 are annealed according to the techniques described above. Following the bonding of the wafers 212, 216, the top surface 217 of the device layer 216 is ground and polished, according to techniques described above, to the required thickness. The SOI device 210 is thus ready for subsequent processing, such as formation of proof masses, removal of a portion of the dielectric layer 214, or the like.

It is apparent to one skilled in the art that various embodiments are not limited to the method described above. For example, the top surface 213 of the handle wafer 212 may be polished while the bottom surface 215 of the device layer 216 may include the trench 230 and mesa 232 pattern. Additional steps may also be performed, such as formation of a cavity in the handle wafer 212. Alternatively, both the top surface 213 of the handle wafer 212 and the bottom surface 215 of the device layer 216 may include trench 230 and mesa 232 patterns.

Figure 4A:
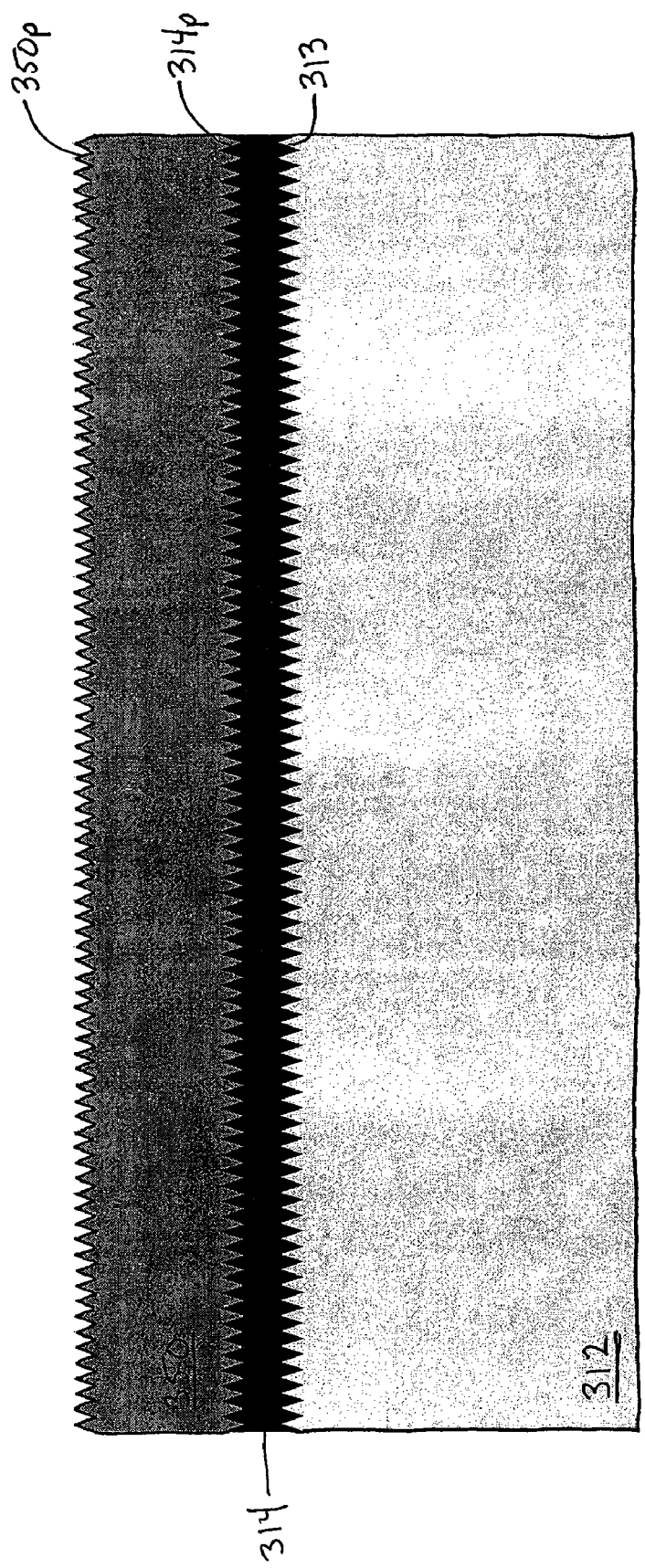
FIG. 4A is an enlarged partial cross-sectional elevational view of a roughened handle wafer following formation of a dielectric layer and an intermediate bonding layer.
Figure 4B:
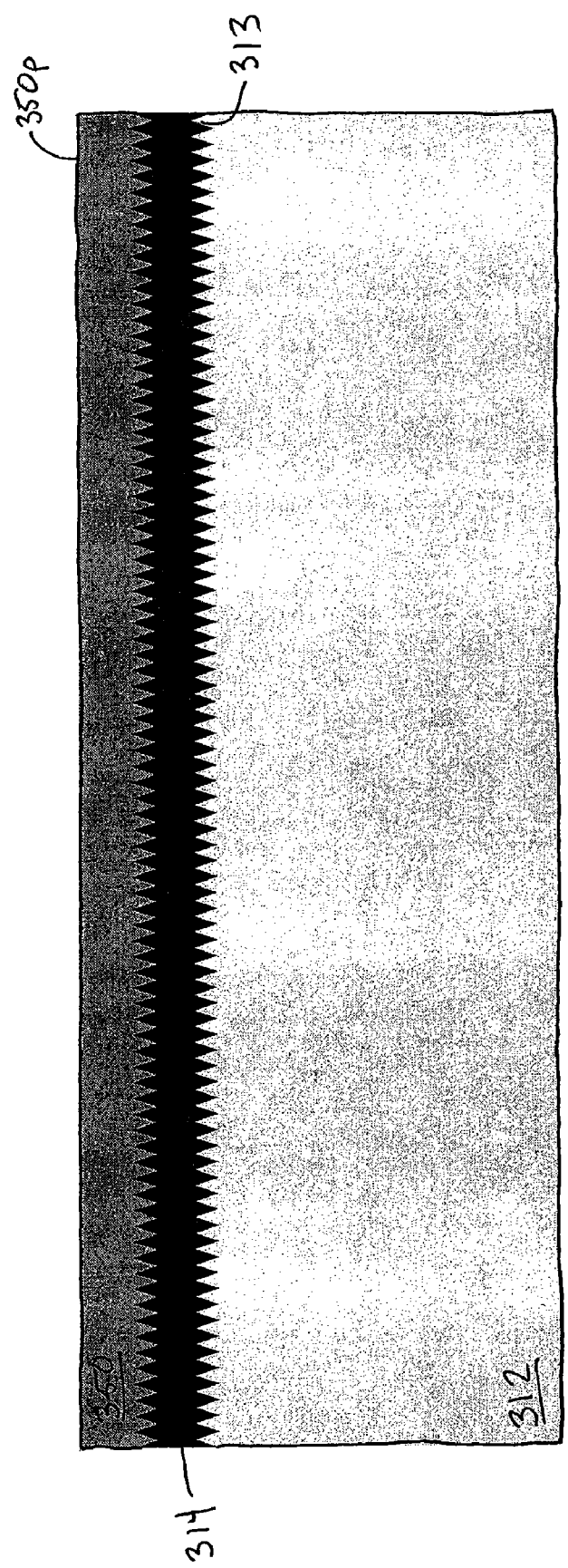
FIG. 4B is an enlarged partial cross-sectional elevational view of the handle wafer of FIG. 4A following polishing of the intermediate bonding layer.
Figure 4C:
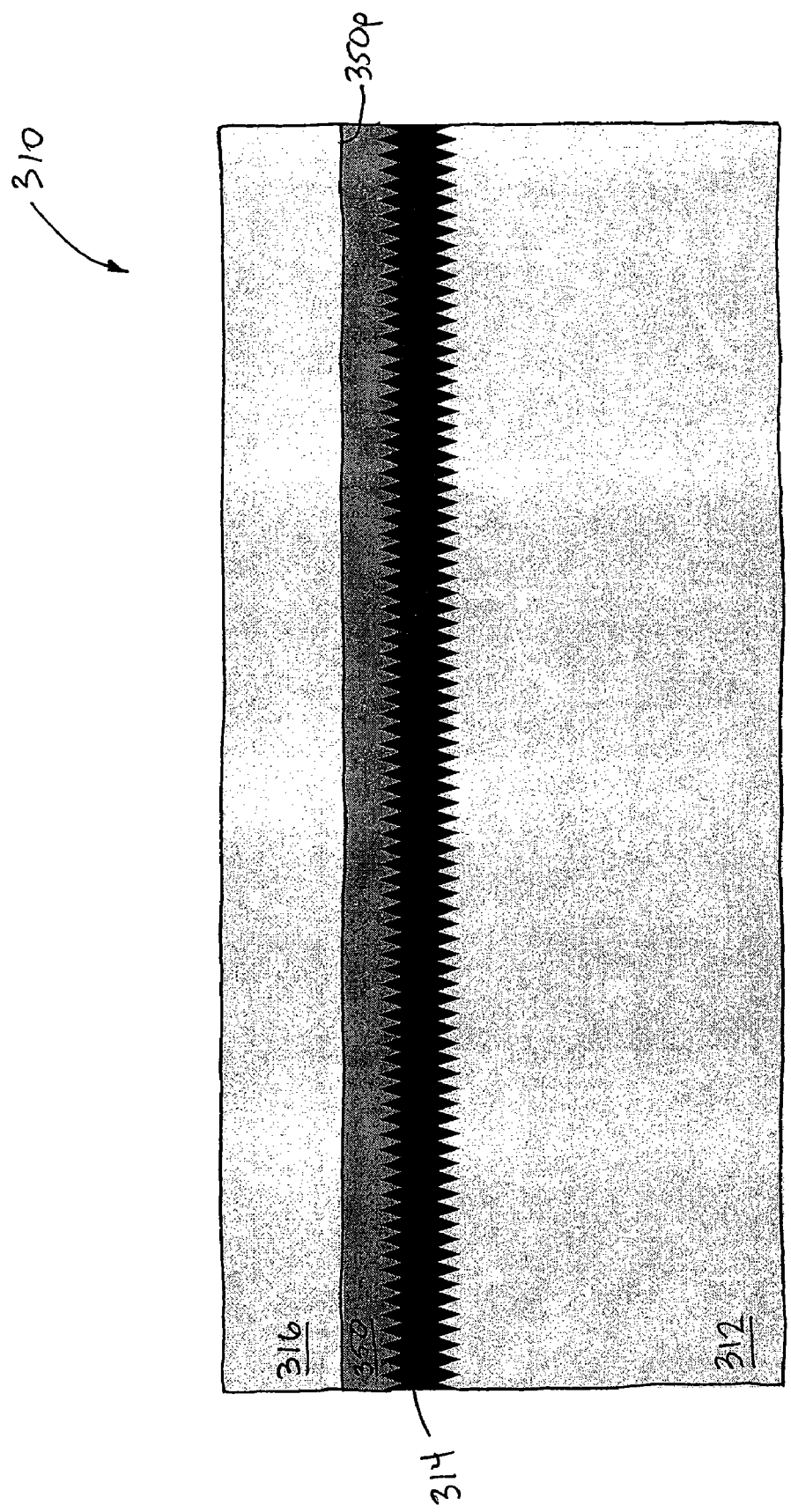
FIG. 4C is an enlarged partial cross-sectional elevational view of the handle wafer of FIG. 4B following application of a device layer.

FIGS. 4A-4C illustrate yet another method of manufacturing a SOI wafer 310 in accordance with still further embodiments of the present invention. In FIG. 4A, a dielectric layer 314 is formed on a roughened top surface 313 of a handle wafer 312 as described above. An intermediate bonding layer 350 is formed on the top surface 314p of the dielectric layer 314, which preferably substantially mirrors the roughening of the handle wafer 312. The intermediate bonding layer 350 is preferably formed of a material suitable for assisting the bonding of the device layer 316 (FIG. 4C), such as tetraethyl orthosilicate (TEOS), suitable sol-gels, glass, or the like. In FIG. 4B, a top surface 350p of the intermediate bonding layer 350 is smoothed using CMP or the like as described above. The device layer 316 is formed in FIG. 4C on the top surface 350p of the intermediate bonding layer 350 using techniques described above.

It is apparent to one skilled in the art that various embodiments are not limited to the method described above. For example, the top surface 313 of the handle wafer 312 may be polished while the bottom surface 315 of the device layer 316 may be roughened. Additional steps may also be performed, such as formation of a cavity in the handle wafer 312. Alternatively, both the top surface 313 of the handle wafer 312 and the bottom surface 315 of the device layer 316 may be roughened.

Figure 5A:
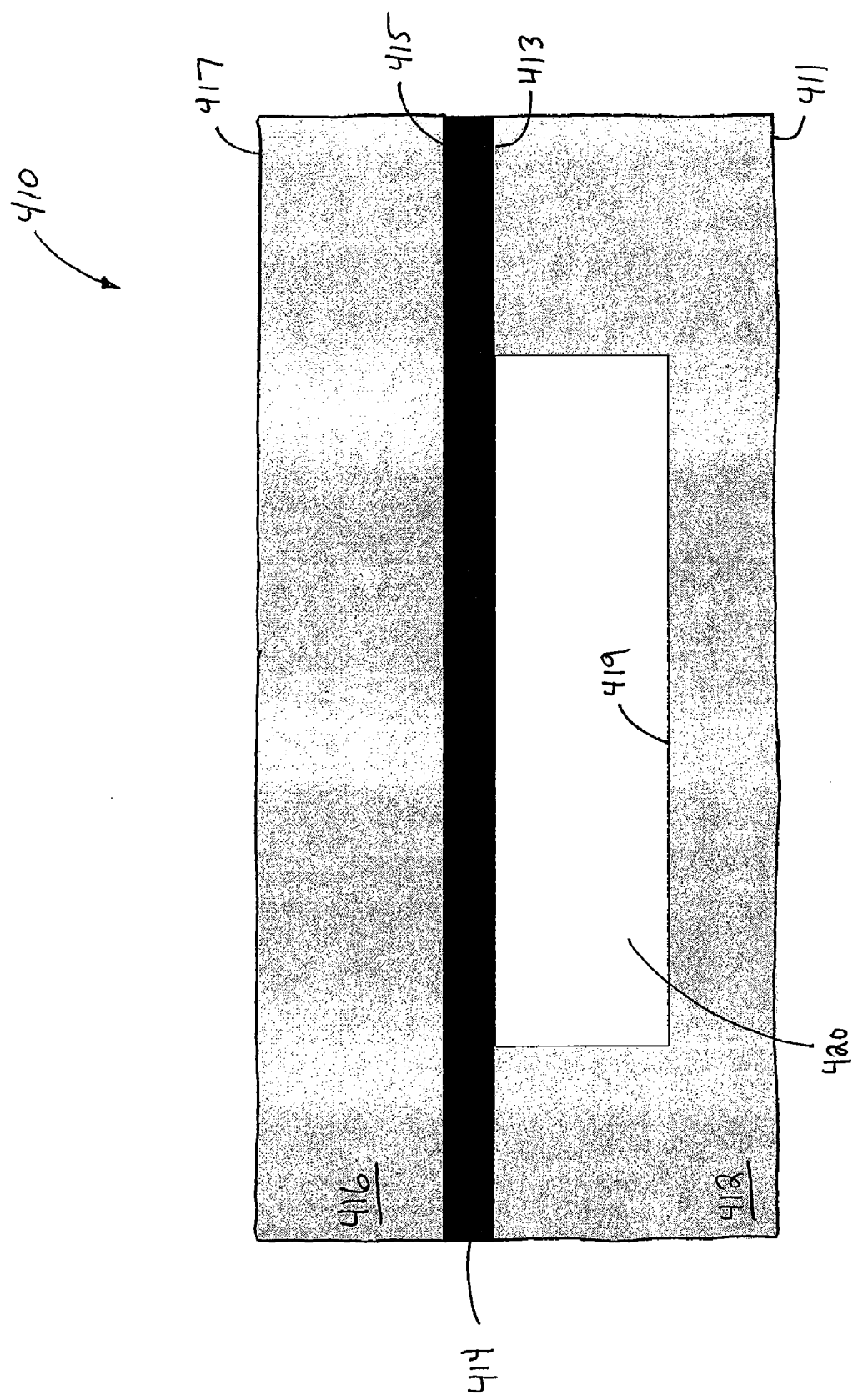
FIG. 5A is an enlarged partial cross-sectional elevational view of a SOI cavity wafer.
Figure 5B:
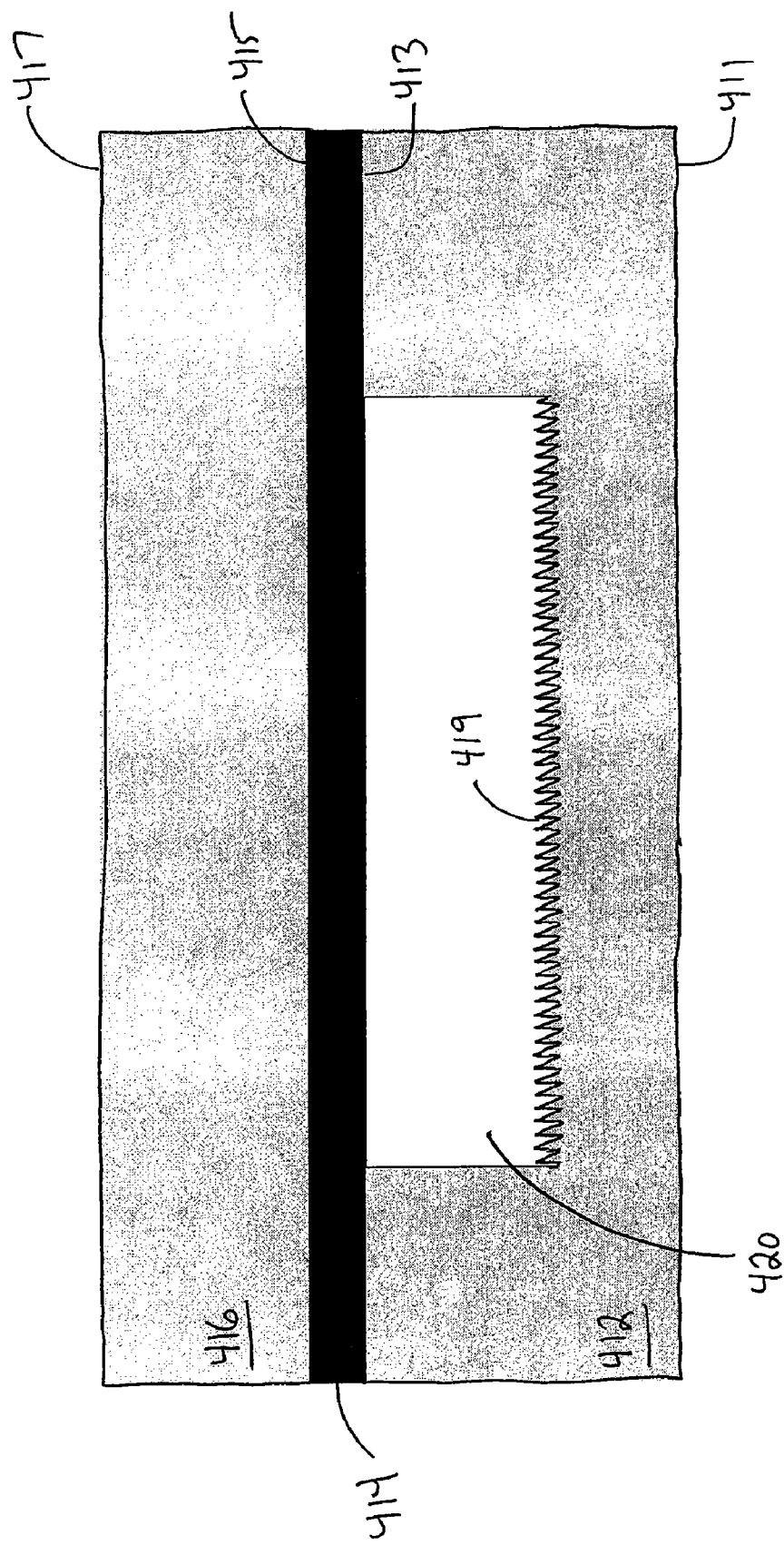
FIG. 5B is an enlarged partial cross-sectional elevational view of the SOI cavity wafer of FIG. 5A wherein a surface of the cavity has been roughened.
Figure 5C:
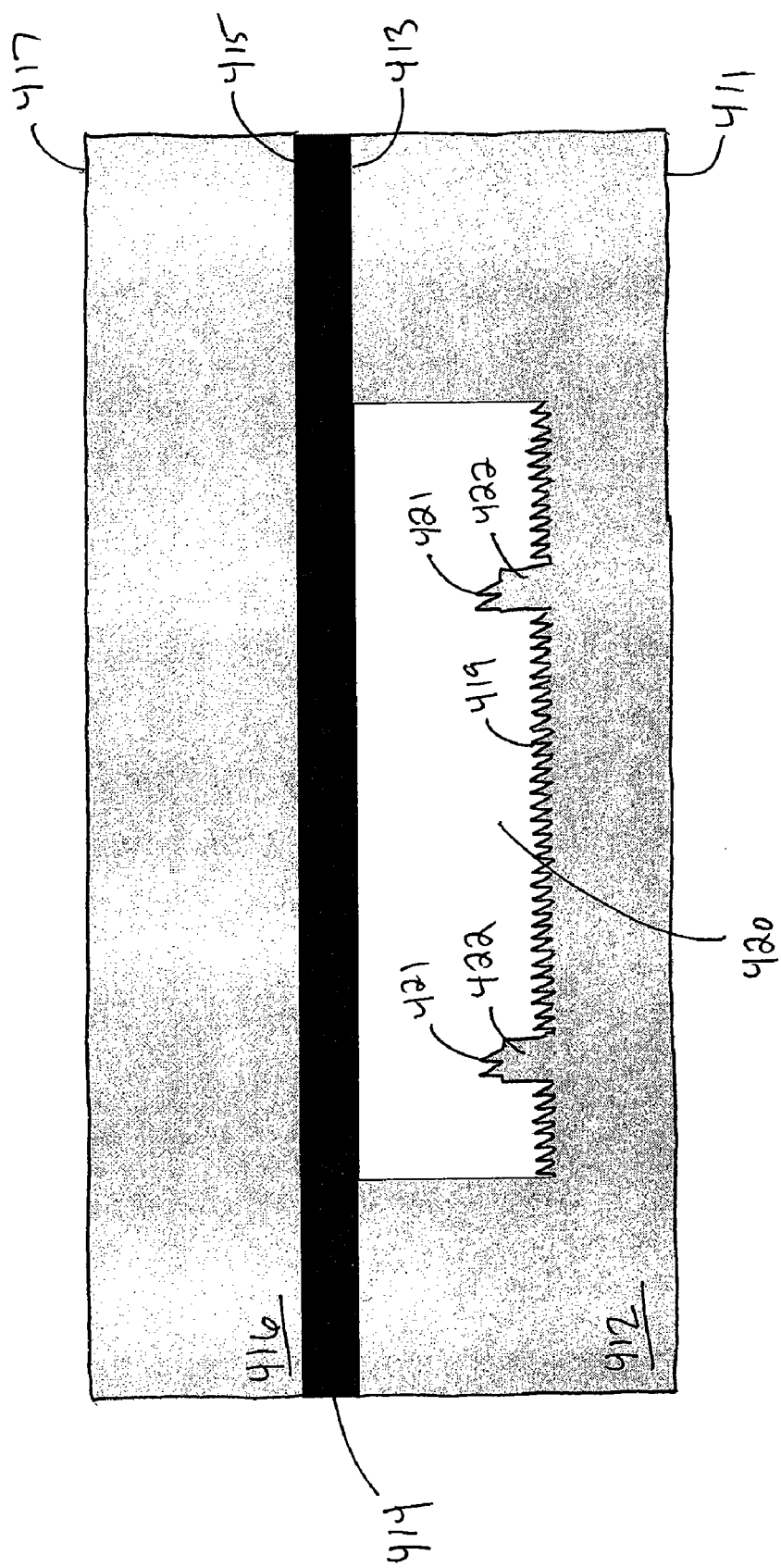
FIG. 5C is an enlarged partial cross-sectional elevational view of a SOI cavity wafer with a roughened surface having raised features therein.

Still another embodiment of the present invention is shown in FIGS. 5A-5C. A SOI wafer 410 is shown in FIG. 5A formed from a handle wafer 412, a dielectric layer 414, and a device layer 416. A cavity 420 is formed from the top surface 413 of the handle wafer 412 beneath the dielectric layer 414. Surfaces 411, 413 of the handle wafer 412 and surfaces 415, 417 of the device layer 416 are shown in FIG. 5A without roughening. However, one or more of the surfaces 411, 413, 415, 417, or portions thereof, may be roughened according to embodiments of the present invention described above. The cavity 420 includes a bottom surface 419 opposite to the dielectric layer 414.

As shown in FIG. 5B, the bottom surface 419 of the cavity 420 is roughened to reduce stiction. The roughening of the bottom surface 419 is preferably performed using a combination of a chemical oxide growth using highly oxidizing solutions (e.g., ammonia and hydrogen peroxide solution, sulfuric acid and hydrogen peroxide solution, de-ionized water and ozone, or the like) and an RIE silicon etch that, in conjunction with the chemical oxide, provides a heavily micromasked (black silicon) surface. However, alternative roughening methods may be used. FIG. 5C shows the cavity 420 including several raised features 422 (e.g. pillars, mesas, or the like). Surfaces 421 of the raised features 422 are also preferably roughened as described above.

The technique described above for roughening the bottom surface of the cavity 420 may also be utilized for other recessed features, such as trenches or the like. The recessed features may also be formed from other surfaces (e.g., surfaces 411, 415, 417) of the handle wafer 412 or device layer 416. Similarly, the technique described above may be to other surfaces (e.g., surfaces 411, 413, 415, 417) or raised features thereon. This technique may thus be used to create antireflection coatings on various devices and sensors. Further, recessed features (such as the cavity 420) or raised features (such as the pillars 422) may be created after roughening of corresponding surfaces. For example, the cavity 420 may be formed after roughening of a portion of the top surface 413 of the handle wafer 412, thus resulting in a roughened bottom surface 419 upon completion of the cavity 420. An advantage is therefore provided in that a recessed feature can be etched to a more precise depth with a greater degree of roughness.

It should be recognized by those skilled in the art that the surface roughening techniques described above may be applied to any bonded semiconductor substrate involving at least one plane wafer. For example, the techniques may be applied to devices having multiple layers of SOI, cavity SOI wafers, and engineered substrates. The techniques described above may also be used to form a buried antireflective layer in optical or infrared (IR) applications. Further, roughening of the surfaces may be confined to certain portions, areas, or the like, and need not blanket the entire surface.

It will be appreciated by those skilled in the art that changes could be made to the embodiments described above without departing from the broad inventive concept thereof. It is understood, therefore, that the invention is not limited to the particular embodiments disclosed, but it is intended to cover modifications within the spirit and scope of the present invention as defined by the appended claims.

I claim:

1. A method of manufacturing a semiconductor device comprising:
   (a) providing a first semiconductor substrate having first and second main surfaces opposite to each other;
   (b) providing a second semiconductor substrate having first and second main surfaces opposite to each other;
   (c) forming a roughened surface on at least one of the first main surface of the first semiconductor substrate and the second main surface of the second semiconductor substrate;
   (d) forming a dielectric layer on the first main surface of the semiconductor substrate;
   (e) disposing the second semiconductor substrate on the dielectric layer opposite to the first semiconductor substrate, the second main surface of the second semiconductor substrate contacting the dielectric layer; and (f) polishing the dielectric layer on the surface opposite the first semiconductor substrate; (g) high temperature annealing; and (h) grinding and polishing the second semiconductor substrate to a required thickness.

2. The method of claim 1, wherein the step of forming the roughened surface comprises performing, on the at least one of the first main surface of the first semiconductor substrate and the second main surface of the second semiconductor substrate, one of low roughness average (RA) grinding, deep reactive ion etching (DRIE), and wet chemical etching.

3. The method of claim 1, wherein step (f) occurs prior to step (e) and steps (g) and (h) occur following step (e).

4. The method of claim 1, wherein the step of forming the roughened surface comprises:
   (i) forming a pattern of photoresistive material on the at least one of the first main surface of the first semiconductor substrate and the second main surface of the second semiconductor substrate; and
   (ii) at least one of wet etching and dry etching the pattern.

5. The method of claim 4, further comprising:
   (f) high temperature annealing; and
   (g) grinding and polishing the second semiconductor substrate to a required thickness.

6. The method of claim 1, wherein the roughened surface is formed on the second main surface of the second semiconductor substrate, the method further comprising:
   (f) forming a cavity from the second main surface of the second semiconductor substrate, the cavity having a roughened surface.

7. The method of claim 6, wherein the cavity includes at least one feature extending from the roughened surface of the cavity.

8. A method of manufacturing a semiconductor device comprising:
   (a) providing a first semiconductor substrate having first and second main surfaces opposite to each other;
   (b) providing a second semiconductor substrate having first and second main surfaces opposite to each other;
   (c) forming a cavity from the second main surface of the second semiconductor substrate;
   (d) forming a dielectric layer on the first main surface of the semiconductor substrate;
   (e) disposing the second semiconductor substrate on the dielectric layer opposite to the first semiconductor substrate, the second main surface of the second semiconductor substrate contacting the dielectric layer; and
   (f) roughening a bottom surface of the cavity.

9. The method of claim 8, further comprising:
   (g) forming at least one feature extending from the bottom surface of the cavity.

10. The method of claim 9, further comprising:
    (h) roughening a surface of the at least one feature.

* * * * *